United States Patent
Kaneko

(10) Patent No.: US 11,955,354 B2
(45) Date of Patent: Apr. 9, 2024

(54) SEMICONDUCTOR SUBSTRATE MANUFACTURING DEVICE APPLICABLE TO LARGE-DIAMETER SEMICONDUCTOR SUBSTRATE

(71) Applicants: KWANSEI GAKUIN EDUCATIONAL FOUNDATION, Hyogo (JP); TOYOTA TSUSHO CORPORATION, Nagoya (JP)

(72) Inventor: Tadaaki Kaneko, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 141 days.

(21) Appl. No.: 17/600,086

(22) PCT Filed: Mar. 25, 2020

(86) PCT No.: PCT/JP2020/013203
§ 371 (c)(1),
(2) Date: Sep. 29, 2021

(87) PCT Pub. No.: WO2020/203517
PCT Pub. Date: Oct. 8, 2020

(65) Prior Publication Data
US 2022/0189798 A1 Jun. 16, 2022

(30) Foreign Application Priority Data
Mar. 29, 2019 (JP) .................. 2019-069279

(51) Int. Cl.
*F27D 7/02* (2006.01)
*C30B 23/02* (2006.01)
(Continued)

(52) U.S. Cl.
CPC ........ *H01L 21/67109* (2013.01); *C30B 23/02* (2013.01); *C30B 33/02* (2013.01);
(Continued)

(58) Field of Classification Search
CPC ... H01L 21/67109; C30B 23/06; C30B 33/02; F27B 17/0016; F27B 17/0025; F27D 5/0037; F27D 7/02
See application file for complete search history.

(56) References Cited

U.S. PATENT DOCUMENTS 5,628,849 A * 5/1997 Fasano ................ F27D 99/0073
156/89.12
5,755,570 A * 5/1998 Shinde ................ F27D 99/0073
248/901
(Continued)

FOREIGN PATENT DOCUMENTS

| JP | 2007238966 A | 9/2007 |
| JP | 2011243640 A | 12/2011 |

(Continued)

OTHER PUBLICATIONS

English Translation of International Search Report from PCT/JP2020/013203 dated Jun. 16, 2020 (2 pages).
(Continued)

*Primary Examiner* — Gregory A Wilson
(74) *Attorney, Agent, or Firm* — Calfee, Halter & Griswold LLP

(57) ABSTRACT

Provided is a semiconductor substrate manufacturing device which is capable of uniformly heating the surface of a semiconductor substrate that has a relatively large diameter or major axis. The semiconductor substrate manufacturing device includes a container body for accommodating a semiconductor substrate and a heating furnace that has a heating chamber which accommodates the container body,
(Continued)

and the heating furnace has a heating source in a direction intersecting the semiconductor substrate to be disposed inside the heating chamber.

12 Claims, 2 Drawing Sheets

(51) Int. Cl.
    *C30B 33/02*     (2006.01)
    *F27B 17/00*     (2006.01)
    *F27D 5/00*     (2006.01)
    *F27D 11/00*     (2006.01)
    *H01L 21/67*     (2006.01)
    *H01L 21/324*     (2006.01)

(52) U.S. Cl.
    CPC ........ *F27B 17/0025* (2013.01); *F27D 5/0037* (2013.01); *F27D 7/02* (2013.01); *F27D 11/00* (2013.01); *H01L 21/324* (2013.01)

(56) References Cited

U.S. PATENT DOCUMENTS

| | | | |
|---|---|---|---|
| 5,911,945 A * | 6/1999 | Fasano | F27D 5/0068 |
| | | | 423/364 |
| 5,989,340 A | 11/1999 | Stephani | |
| 6,780,795 B2 * | 8/2004 | Suzuki | H01L 21/67248 |
| | | | 438/758 |
| 7,126,087 B2 * | 10/2006 | Kamata | F27D 19/00 |
| | | | 219/390 |
| 7,144,823 B2 * | 12/2006 | Saito | H01L 21/67098 |
| | | | 438/758 |
| 7,862,334 B2 * | 1/2011 | Yang | F27B 5/04 |
| | | | 414/935 |
| 9,449,825 B2 * | 9/2016 | Yokouchi | H01L 21/26 |
| 10,453,713 B2 * | 10/2019 | Cho | H01L 21/02238 |
| 10,460,922 B2 * | 10/2019 | Hoffman | H01L 21/6719 |
| 11,201,054 B2 * | 12/2021 | Isobe | H01L 21/02186 |
| 11,359,307 B2 * | 6/2022 | Kaneko | C30B 23/063 |
| 2007/0098904 A1 * | 5/2007 | Aschner | F27D 5/0037 |
| | | | 118/724 |
| 2008/0311761 A1 * | 12/2008 | Nenyei | F27B 5/04 |
| | | | 257/E21.094 |
| 2011/0117693 A1 * | 5/2011 | Palm | H01L 31/1864 |
| | | | 257/E21.328 |
| 2013/0337394 A1 * | 12/2013 | Asari | F27D 5/0037 |
| | | | 432/198 |
| 2022/0189798 A1 * | 6/2022 | Kaneko | C30B 29/36 |

FOREIGN PATENT DOCUMENTS

| | | | | |
|---|---|---|---|---|
| JP | 2012028446 A | | 2/2012 | |
| JP | 2012510951 A | | 5/2012 | |
| JP | 2017066019 A | * | 4/2017 | |
| JP | 2017066019 A | | 4/2017 | |
| JP | 2019019042 A | | 2/2019 | |
| KR | 2015079145 A | * | 7/2015 | ........... F27D 5/0012 |
| WO | 2009020023 A1 | | 2/2009 | |
| WO | 2016117251 A1 | | 7/2016 | |
| WO | 2017188381 A1 | | 11/2017 | |

OTHER PUBLICATIONS

Search Report from European Application No. 20784425.9 dated Nov. 25, 2022 (8 pages).
Office action from Chinese Application No. 202080024446.1 dated Mar. 24, 2023.

* cited by examiner

SEMICONDUCTOR SUBSTRATE MANUFACTURING DEVICE APPLICABLE TO LARGE-DIAMETER SEMICONDUCTOR SUBSTRATE

CROSS-REFERENCE TO RELATED APPLICATIONS

This application is a 371 of PCT Application No. PCT/JP2020/013203, filed on Mar. 25, 2020, which claims priority to Japanese Application No. 2019-069279, filed on Mar. 29, 2019, the contents of which are hereby incorporated by reference as if recited in their entirety.

TECHNICAL FIELD

The present invention relates to a device for manufacturing a semiconductor substrate applicable to a large-diameter semiconductor substrate.

BACKGROUND ART

In conventional heating furnaces used for heating a semiconductor substrate, a heater is generally arranged on a side wall so as to surround a periphery of a semiconductor substrate.

For example, Patent Literature 1 discloses a SiC semiconductor wafer heat treatment device including a plurality of heaters arranged so as to surround a periphery of a SiC substrate, and heater support portions that support the heaters, respectively, in which each of the heaters is detachable integrally with the corresponding heater support portion.

CITATION LIST

Patent Literature

Patent Literature 1: JP 2012-028446 A

SUMMARY OF INVENTION

Technical Problem

Conventional devices for manufacturing a semiconductor substrate can uniformly heat the surface of the substrate when the diameter or long diameter of the substrate is relatively small.

A semiconductor substrate is required to perform heat treatment of a semiconductor substrate having a large diameter or long diameter from the viewpoint of cost and manufacturing efficiency.

However, when a diameter or long diameter of a semiconductor substrate is large, the central portion of the substrate is not sufficiently heated in a conventional device, and there is a problem that heat treatment cannot be performed at a time.

An object of the present invention is to provide a device for manufacturing a semiconductor substrate capable of uniformly heating a surface.

Solution to Problem

The present invention to solve the above problems is a device for manufacturing a semiconductor substrate including:

a main container that accommodates a semiconductor substrate; and a heating furnace having a heating chamber that accommodates the main container, in which the heating furnace includes a heating source in a direction intersecting with a main surface of the semiconductor substrate to be arranged in the heating chamber.

As described above, the heating source is provided in the direction intersecting with the main surface of the semiconductor substrate to be arranged in the heating chamber, so that the entire main surface of the semiconductor substrate can be uniformly heated.

In a preferred embodiment of the present invention, the heating source has a heat equalizing range for uniformly heating the main surface of the semiconductor substrate.

With such a configuration, the entire main surface of the semiconductor substrate can be more uniformly heated.

In a preferred embodiment of the present invention, the heating source has a heating portion that generates heat, and an area of the heating portion is equal to or larger than an area of the semiconductor substrate.

With such a configuration, the entire main surface of the semiconductor substrate can be more uniformly heated.

In a preferred embodiment of the present invention, the heating source has a heating portion that generates heat, and the heating portion is arranged substantially parallel to the main surface of the semiconductor substrate.

With such a mode, the entire main surface of the semiconductor substrate can be more uniformly heated.

In a preferred embodiment of the present invention, the heating source is arranged at a position facing the main surface.

In a preferred embodiment of the present invention, the heating source includes:

a first heating source arranged at a position facing the main surface; and a second heating source at a position facing the first heating source, and the main container is provided at a position sandwiched between the first heating source and the second heating source.

With such a mode, the main surface of the semiconductor substrate can be more uniformly heated.

In a preferred embodiment of the present invention, the first heating source is provided on the top surface side in the heating chamber, and the second heating source is provided on the bottom surface side in the heating chamber.

In a preferred embodiment of the present invention, the heating furnace can perform heating in a manner to form a temperature gradient in a substantially vertical direction to the semiconductor substrate to be arranged in the heating chamber.

With such a mode, it is possible to grow or etch a semiconductor substrate using a temperature gradient as a driving force.

In a preferred embodiment of the present invention, the device for manufacturing a semiconductor substrate is used for heating a semiconductor substrate having a diameter or long diameter of 6 inches or above.

The device for manufacturing a semiconductor substrate according to the present invention is suitable for heating a semiconductor substrate having a large diameter or long diameter.

In a preferred embodiment of the present invention, at least a part of the main container is a release and reception body that transports atoms to and from a semiconductor substrate.

With such a configuration, the growth or etching of the semiconductor substrate proceeds without separately accommodating a growth raw material in the main container.

In a preferred embodiment of the present invention, the main container is made of a material containing an atomic species constituting the semiconductor substrate.

In a preferred embodiment of the present invention, the main container is made of a material containing all atomic species constituting the semiconductor substrate.

In a preferred embodiment of the present invention, a gaseous species vapor pressure space which accommodates the main container and in which a vapor pressure environment of a gaseous species of an atomic species constituting the semiconductor substrate is formed is further provided.

With such a configuration, heating can be performed while maintaining the environment inside the main container.

In a preferred embodiment of the present invention, the inside of the main container is exhausted through the gaseous species vapor pressure space.

With such a configuration, it is possible to suppress evacuation of gaseous species containing an atomic species constituting the semiconductor substrate in the main container.

In a preferred embodiment of the present invention, a high melting point container having the gaseous species vapor pressure space is provided, the high melting point container being configured to accommodate the main container.

In a preferred embodiment of the present invention, the high melting point container includes a vapor supply source capable of supplying vapor pressure of a gaseous species containing an atomic species constituting the semiconductor substrate.

With such a configuration, the vapor pressure of the gaseous species in the main container and the vapor pressure of the gaseous species outside the main container can be balanced, and the environment in the main container can be maintained.

Advantageous Effects of Invention

According to the disclosed technology, it is possible to uniformly heat a main surface of a semiconductor substrate having a large diameter or long diameter.

DESCRIPTION OF EMBODIMENTS

Hereinafter, a device for manufacturing a semiconductor substrate (hereinafter, simply referred to as a manufacturing device) according to an embodiment of the present invention will be described in detail with reference to the drawings. The technical scope of the present invention is not limited to the embodiments illustrated in the accompanying drawings, and can be appropriately changed within the scope described in the claims.

Figure 1:
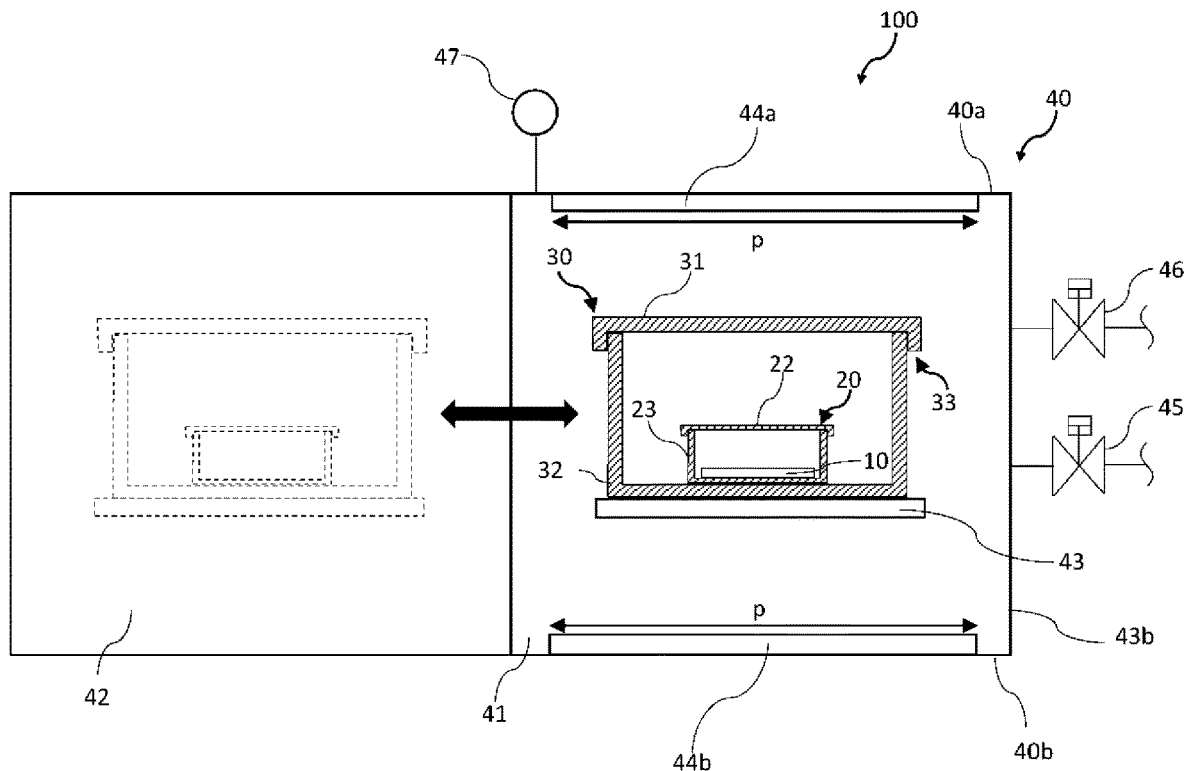
FIG. 1 is a diagram illustrating a device for manufacturing a semiconductor substrate according to Example 1.

FIG. 1 illustrates a manufacturing device 100 according to Example 1.

The manufacturing device 100 includes a main container 20 that accommodates a semiconductor substrate 10, a high melting point container 30 that accommodates the main container 20, and a heating furnace 40.

The semiconductor substrate 10 includes a main surface 11. In the present specification, the main surface refers to a surface on which the semiconductor substrate is grown or etched.

As the main surface, a surface provided with an off angle of 0.4 to 8° from (0001) surface or (000-1) surface can be exemplified.

Examples of the semiconductor substrate 10 can include a semiconductor wafer obtained by slicing a semiconductor ingot produced by a sublimation method or the like into a disk shape, and a semiconductor substrate obtained by processing single crystal semiconductor into a thin plate shape.

As the semiconductor substrate, a semiconductor substrate that can be grown by a vapor phase method is preferably used. Specifically, a SiC substrate can be exemplified.

The main container 20 is a fitting container including an upper container 22 and a lower container 23 that can be fitted to each other. A minute gap 24 is formed in a fitting portion between the upper container 22 and the lower container 23, and the inside of the main container 20 can be exhausted (evacuated) from the gap 24 (see FIG. 2).

The main container 20 is made of a material containing an atomic species constituting the semiconductor substrate. For example, when the semiconductor substrate 10 is a SiC substrate, a material containing polycrystalline SiC can be exemplified as the material of the main container 20.

In the present specification, the "atomic species constituting the semiconductor substrate" means atomic species constituting the main skeleton constituting the semiconductor substrate, and does not include impurities such as dopants. The "material containing an atomic species constituting the semiconductor substrate" may contain impurities such as dopants.

In the present invention, the main container is preferably made of a material containing all the atomic species constituting the semiconductor substrate, and more preferably made of a material containing only the atomic species constituting the semiconductor substrate.

By heating the main container 20 made of such a material, an atmosphere containing an atomic species constituting the semiconductor substrate 10 can be formed. In this case, a part of the main container 20 serves as the release and reception body 21 that transports atoms to and from the semiconductor substrate 10. Note that the release and reception body is a generic term for materials containing an atomic species constituting a semiconductor substrate, and transmitting or receiving atoms to and from the semiconductor substrate by heating.

In Example 1, the release and reception body 21 is a part of the main container 20 existing at a position facing the main surface 11.

The high melting point container 30 contains a high melting point material. As the high melting point material, for example, C which is a general-purpose heat-resistant member, W, Re, Os, Ta, and Mo which are high melting point metals, $Ta_9C_8$, HfC, TaC, NbC, ZrC, $Ta_2C$, TiC, WC, and MoC which are carbides, HfN, TaN, BN, Ta$_2$N, ZrN, and TiN which are nitrides, HfB$_2$, TaB$_2$, ZrB$_2$, NB$_2$, TiB$_2$ which are borides, polycrystalline SiC, and the like can be exemplified.

Figure 2:
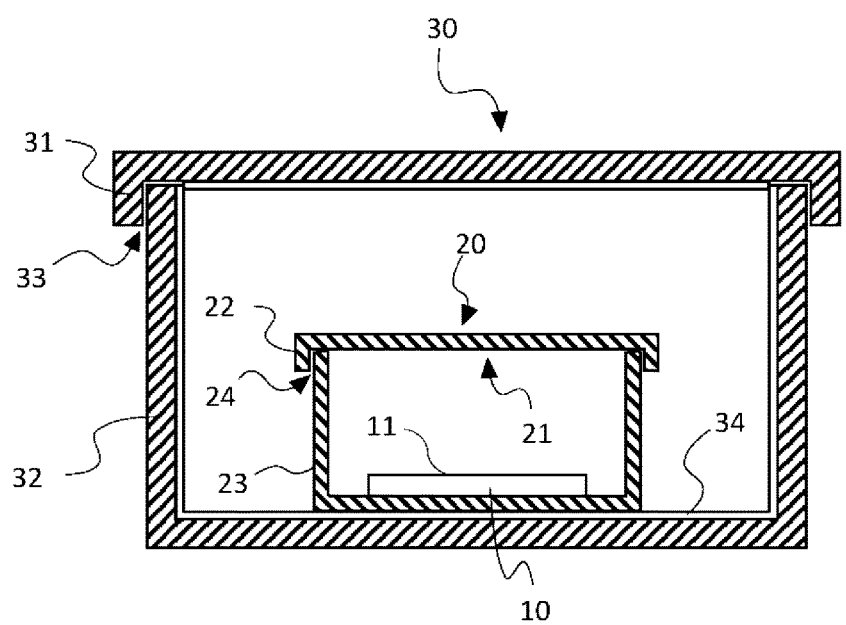
FIG. 2 is a diagram illustrating a device for manufacturing the semiconductor substrate according to Example 1.

The atmosphere containing the atomic species constituting the semiconductor material in the main heating chamber 41 according to the present embodiment includes a vapor supply source 34 capable of supplying vapor pressure of the gaseous species containing the atomic species constituting the semiconductor substrate 10 into the high melting point container 30 (see FIG. 2). It is sufficient that the vapor supply source 34 is configured to generate the vapor pressure of the gaseous species (gaseous species vapor pressure space) in the high melting point container 30 during the heat treatment. For example, when the semiconductor substrate 10 is a SiC substrate, solid Si (Si pellet such as a single crystal Si piece or Si powder) and a Si compound can be exemplified.

As similar to the main container 20, the high melting point container 30 is a fitting container including an upper container 31 and a lower container 32 that can be fitted to each other, and is configured to be able to accommodate the main container 20. A minute gap 33 is formed in a fitting portion between the upper container 31 and the lower container 32, and the inside of the high melting point container 30 can be exhausted (evacuated) from the gap 33.

In the present embodiment, the main container 20 is arranged in the high melting point container 30 having the gaseous species vapor pressure space in which the vapor pressure environment of the gaseous species containing the atomic species constituting the semiconductor substrate is formed.

The main container 20 is exhausted through the gaseous species vapor pressure space, so that it is possible to suppress the evacuation of the gaseous species containing the atomic species constituting the semiconductor substrate from the inside of the main container 20. Further, by heating the semiconductor substrate 10 in the main container 20 having a space to be exhausted through the gaseous species vapor pressure space, the vapor pressure of the gaseous species in the main container 20 and the vapor pressure of the gaseous species outside the main container 20 (in the high melting point container 30) can be balanced, and the environment in the main container 20 can be maintained.

The heating furnace 40 includes a main heating chamber 41 capable of heating an object to be processed (semiconductor substrate 10 or the like) to a temperature of equal to or higher than 800° C. and equal to or lower than 2500° C., and a preheating chamber 42 capable of preheating the object to be processed to a temperature of equal to or higher than 500° C. The heating furnace 40 further includes a moving means 43 (moving table) that can move the object to be processed from the preheating chamber 42 to the main heating chamber 41.

The preheating chamber 42 is connected to the main heating chamber 41, and is configured to be able to move the high melting point container 30 by the moving means 43. The preheating chamber 42 of the present embodiment is configured to be capable of raising the temperature by residual heat of the heating source 44 of the main heating chamber 41. For example, when the temperature of the main heating chamber 41 is raised to 2000° C., the temperature of the preheating chamber 42 is raised to about 1000° C., and the object to be processed (semiconductor substrate 10, main container 20, high melting point container 30, and the like) can be degassed.

The moving means 43 is configured to be able to move the high melting point container 30 between the inside of the main heating chamber 41 and the inside of the preheating chamber 42. Since the transportation between the main heating chamber 41 and the preheating chamber 42 by the moving means 43 is completed in about 1 minute at the shortest, it is possible to realize temperature rise and temperature drop at 1 to 1000° C./min.

Since the rapid temperature raise and the rapid temperature drop can be performed in this manner, it is possible to observe a surface shape having no low-temperature growth history during temperature rise and temperature drop, which is difficult in conventional devices.

In FIG. 1, the preheating chamber 42 is arranged leftward from the main heating chamber 41. However, the present invention is not limited to this, and the preheating chamber 42 may be arranged in any direction.

A vacuum forming valve 45 for exhausting the inside of the main heating chamber 41, an inert gas injection valve 46 for introducing an inert gas into the main heating chamber 41, and a vacuum gauge 47 for measuring the degree of vacuum in the main heating chamber are connected to the main heating chamber 41.

The vacuum forming valve 45 is connected to an evacuation pump that exhausts and evacuates the inside of the main heating chamber 41 (not illustrated). The degree of vacuum in the main heating chamber 41 can be adjusted to, for example, 10 Pa or lower, more preferably 1 Pa or lower, and still more preferably $10^{-3}$ Pa or lower by the vacuum forming valve 45 and the evacuation pump. Examples of the evacuation pump can include a turbo molecular pump.

The inert gas injection valve 46 is connected to an inert gas supply source (not illustrated). By the inert gas injection valve 46 and the inert gas supply source, the inert gas can be introduced into the main heating chamber 41 in the range of $10^{-5}$ to 10000 Pa. As the inert gas, Ar, He, N$_2$, or the like can be selected.

The inert gas injection valve 46 is a dopant gas supply means capable of supplying a dopant gas into the main container 20. That is, by selecting a dopant gas (for example, N$_2$ or the like) as the inert gas, the growth layer 12 can be doped with a dopant to increase the doping concentration.

The heating furnace 40 includes a heating source 44 that heats the inside of the main heating chamber 41.

As the heating source 44, a first heating source 44a is provided on a top surface 40a inside the main heating chamber 41, and a second heating source 44b is provided on a bottom surface 40b inside the main heating chamber.

In other words, the first heating source 44a is provided at a position facing the main surface 11, and the second heating source 44b is provided at a position facing the first heating source 44a and at a position sandwiching the high melting point container 30 accommodating the main container 20.

Note that the "first heating source" and the "second heating source" are merely used as names for convenience in order to clarify differences in heating source.

Each of the first heating source 44a and the second heating source 44b has a heating portion p that generates heat.

Figure 3:
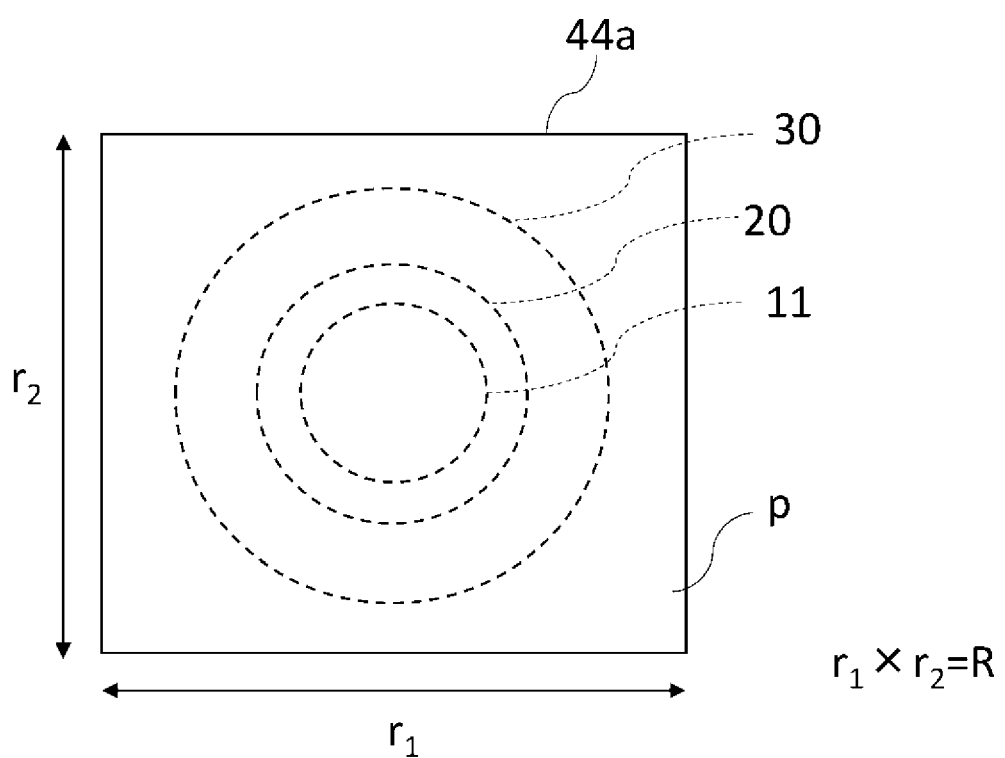
FIG. 3 is a schematic diagram illustrating only a first heating source and a region surrounding a main surface of a semiconductor substrate, a surface of a main container, and a surface of a high melting point container when the manufacturing device according to Example 1 is viewed from above.

FIG. 3 is a schematic diagram illustrating the first heating source 44a, and only the main surface of the semiconductor substrate 10, the surface of the main container 20 facing the first heating source 44a, and the surface of the high melting point container 30 facing the first heating source 44a when the manufacturing device 100 is viewed from above. An area R of the heating portion p of the first heating source 44a is equal to or larger than the area of the main surface 11, the area of the surface of the main container 20, and the area of the high melting point container 30. Although not illustrated, the area R of the heating portion p of the second heating source 44b is substantially the same as the area R of the heating portion p of the first heating source 44a.

Such first heating source 44a has a heat equalizing range for uniformly heating the main surface 11 of the semiconductor substrate 10, the surface of the body container 20 facing the first heating source 44a, and the surface of the high melting point container 30 facing the first heating source 44a.

In the present specification, the heat equalizing range means a range in which an arbitrary region can be heated substantially in the same manner, and as long as the state of the arbitrary region after the heat treatment is uniform, a slight temperature difference at each point in the region is allowed.

The allowable temperature difference is, for example, −10 to +10° C., preferably −8 to +8° C., more preferably −6 to +6° C., still more preferably −4 to +4° C., particularly preferably −2 to +2° C., and most preferably −1 to +1° C.

The heating furnace 40 can perform heating so as to form a temperature gradient in a direction substantially perpendicular to the main surface 11.

By forming a temperature gradient in a direction substantially perpendicular to the main surface 11, the semiconductor substrate 10 and the release and reception body 21 transport atoms using the temperature gradient as a driving force, and growth or etching of the semiconductor substrate 10 is caused.

Examples of the means of forming the temperature gradient include means of providing a difference in the heat generation amount between the first heating source 44a and the second heating source 44b, and means of arranging a heat reflecting member such as a multilayer heat reflecting metal plate in the heating furnace 40 so as to form a temperature gradient in the above-described direction.

In the present embodiment, minute heat is released from the contact portion between a moving means 43 (moving table) and the high melting point container 30. That is, even when currents of the same intensity are caused to flow through the first heating source 44a and the second heating source 44b, a temperature gradient in which the temperature decreases from the upper portion toward the lower portion of the high melting point container 30 is formed.

The heating source 44 preferably has a diameter or long diameter of 6 inches or above, and more preferably 8 inches or above.

The heating source 44 preferably has an area larger than the area of the main surface of the semiconductor substrate having a diameter of 6 inches or above, and more preferably has an area larger than the area of the main surface having a diameter of 8 inches or above.

In the manufacturing device 100 of Example 1 configured as described above, heating can be uniformly performed over the entire main surface 11.

Therefore, the manufacturing device of the present invention is preferably used for heating a semiconductor substrate having a diameter or long diameter of 6 inches or above, and more preferably used for heating a semiconductor substrate having a diameter or long diameter of 8 inches or above.

Although the manufacturing device 100 according to Example 1 has been described above, the manufacturing device of the present invention is not limited thereto.

It is sufficient that the heating source (44a, 44b) is provided in a direction intersecting with the main surface of the semiconductor substrate to be arranged in the heating chamber, and is preferably provided in a substantially vertical direction.

The heating portion (p) of the heating source (44a, 44b) is preferably substantially parallel to the main surface of the semiconductor substrate.

Further, as the heating source, it is more preferable that a first heating source is provided at a position facing the main surface of the semiconductor substrate, and it is still more preferable that a second heating source is provided at a position facing the first heating source and sandwiching the main container.

The heating source preferably includes a first heating source on the top surface side and a second heating source on the bottom surface side.

The area of the heating portion of the heating source is preferably equal to or larger than the area of the main surface of the semiconductor substrate, more preferably equal to or larger than the area of the surface of the main container facing the heating source, and still more preferably equal to or larger than the area of the surface of the high melting point container facing the heating source.

In the mode including the first heating source and the second heating source, the areas of the heating portions in the first heating source and the second heating source are preferably substantially the same.

The first heating source may be a first heating source group including a plurality of independent heating sources. In this case, each of the heating sources is provided so as to be substantially parallel to the main surface of the semiconductor substrate and located on the same plane facing the main surface.

The area of the heating portion in the first heating source group described above is a total area obtained by summing the areas of the heating portions of the first heating sources constituting the first heating source group.

Similarly, the second heating source may be a second heating source group.

The heating source preferably has a heat equalizing range for uniformly heating the main surface of the semiconductor substrate, more preferably has a heat equalizing range for uniformly heating the surface of the main container facing the heating source, and still more preferably has a heat equalizing range for uniformly heating the surface of the high melting point container facing the heating source.

Whether or not the heating source has the above-described heat equalizing range can be estimated, for example, by observing the etching amount or the growth amount in the plane direction of the semiconductor substrate subjected to the heat treatment by the manufacturing device.

In Example 1, a mode in which the main container 20 is made of a material containing an atomic species constituting the semiconductor substrate 10 has been exemplified, but the present invention is not limited thereto, and it is sufficient that a release and reception body that transports atoms to and from the semiconductor substrate exists in the main container.

For example, the main container may include a holding unit that holds a material serving as a release and reception body that transports atoms to and from the semiconductor substrate.

Further, the manufacturing device of the present invention preferably has a configuration in which the semiconductor substrate is arranged in a semi-closed space.

The semi-closed space in the present specification refers to a space in which the inside of the container can be evacuated but at least a part of the steam generated in the container can be confined.

By providing the semi-closed space, it is possible to suppress an unintended reaction of the semiconductor substrate and the main container.

REFERENCE SIGNS LIST

10 Semiconductor substrate
11 Main surface
20 Main container
21 Transmitting and receiving body
22 Upper container
23 Lower container
24 Gap
30 High melting point container
31 Upper container
32 Lower container
33 Gap
34 Steam supply source
40 Heating furnace
40a Top surface
40b Bottom surface
40c Side wall surface
41 Main heating chamber
42 Preheating chamber
43 Moving means
44a First heating source
44b Second heating source
45 Vacuum forming valve
46 Inert gas injection valve
47 Vacuum gauge
100 Device for manufacturing semiconductor substrate
p Heating portion
R Area of heating portion

The invention claimed is:

1. A device for manufacturing a semiconductor substrate comprising:
   a main container that accommodates a semiconductor substrate;
   a high melting point container; and
   a heating furnace having a heating chamber that accommodates the main container and the high melting point container,
   wherein the heating furnace includes a heating source in a direction intersecting with main surface of the semiconductor substrate to be arranged in the heating chamber,
   wherein the main container is made of a material containing all atomic species constituting the semiconductor substrate,
   wherein the high melting point container comprising a gaseous species vapor pressure space which accommodates the main container and in which a vapor pressure environment of a gaseous species of an atomic species constituting the semiconductor substrate is formed,
   wherein an inside of the main container is exhausted through the gaseous species vapor pressure space.

2. The device for manufacturing a semiconductor substrate according to claim 1, wherein the heating source has a heat equalizing range for uniformly heating the main surface of the semiconductor substrate.

3. The device for manufacturing a semiconductor substrate according to claim 1, wherein the heating source has a heating portion that generates heat, and an area of the heating portion is equal to or larger than an area of the surface of the main container facing the heating source.

4. The device for manufacturing a semiconductor substrate according to claim 1, wherein the heating source has a heating portion that generates heat, and the heating portion is arranged substantially parallel to the main surface of the semiconductor substrate.

5. The device for manufacturing a semiconductor substrate according to claim 1, wherein the heating source is arranged at a position facing the main surface.

6. The device for manufacturing a semiconductor substrate according to claim 1, wherein the heating source includes: a first heating source arranged at a position facing the main surface; and a second heating source at a position facing the first heating source, and the main container is provided at a position sandwiched between the first heating source and the second heating source.

7. The device for manufacturing a semiconductor substrate according to claim 6, wherein the first heating source is provided on a top surface side in the heating chamber, and the second heating source is provided on a bottom surface side in the heating chamber.

8. The device for manufacturing a semiconductor substrate according to claim 1, wherein the heating furnace can perform heating in a manner to form a temperature gradient in a substantially vertical direction to the semiconductor substrate to be arranged in the heating chamber.

9. The device for manufacturing a semiconductor substrate according to claim 1, configured to be used for heating a semiconductor substrate having a diameter or long diameter of 6 inches or above.

10. The device for manufacturing a semiconductor substrate according to claim 1, wherein at least a part of the main container is a release and reception body that transports atoms to and from a semiconductor substrate.

11. The device for manufacturing a semiconductor substrate according to claim 1, wherein the high melting point container includes a vapor supply source capable of supplying vapor pressure of a gaseous species containing an atomic species constituting the semiconductor substrate.

12. The device for manufacturing a semiconductor substrate according to claim 1, wherein the heating source has a heating portion that generates heat, and an area of the heating portion is equal to or larger than an area of the surface of the high melting point container facing the heating source.

* * * * *